United States Patent [19]
Herlinger et al.

[11] Patent Number: 5,833,753
[45] Date of Patent: Nov. 10, 1998

[54] REACTOR HAVING AN ARRAY OF HEATING FILAMENTS AND A FILAMENT FORCE REGULATOR

[75] Inventors: James E. Herlinger, Portola Valley; David K. Studley, Sunnyvale; Jerry W. Zimmer, Saratoga, all of Calif.

[73] Assignee: sp³, Inc., Mountain View, Calif.

[21] Appl. No.: 575,763

[22] Filed: Dec. 20, 1995

[51] Int. Cl.⁶ .................................................. C23C 16/00
[52] U.S. Cl. .................................... 118/724; 118/723 HC
[58] Field of Search ............................. 118/723 HC, 724

[56] References Cited

U.S. PATENT DOCUMENTS

| | | | |
|---|---|---|---|
| 3,659,767 | 5/1972 | Martin | 26/195 |
| 3,670,066 | 6/1972 | Valyi | 264/148 |
| 3,825,129 | 7/1974 | Beck | 214/2.5 |
| 4,953,499 | 9/1990 | Anthony et al. | 118/724 |
| 4,958,592 | 9/1990 | Anthony et al. | 118/724 |
| 4,970,986 | 11/1990 | Anthony et al. | 118/724 |

*Primary Examiner*—Richard Bueker
*Attorney, Agent, or Firm*—Wilson Sonsini Goodrich & Rosati; Robert Moll; Charles D. Holland

[57] ABSTRACT

An apparatus for adjusting the tension on a heating filament in a reactor used in carbon deposition on a substrate via chemical-vapor deposition is disclosed, as is a method for preventing breakage of the filaments during operation. The apparatus comprises a force regulator attached to an array of heating filaments. Preferably, the force regulator is adjustable and is adjusted prior to reactor operation and/or periodically or continuously as the filaments lengthen due to carburization in the carbon-vapor environment of the reactor. The adjustable force regulator attached to an array of filaments enables effective regulation of the force on a filament during reactor operation and provides an easily-maintained reactor with quick turn-around time between cycles of use.

32 Claims, 3 Drawing Sheets

REACTOR HAVING AN ARRAY OF HEATING FILAMENTS AND A FILAMENT FORCE REGULATOR

BACKGROUND OF THE INVENTION

This invention relates to an improved apparatus for making diamond-coated tools.

Diamond-coating of tools has been performed for a number of years. Diamond-coating provides a strong and highly abrasive tool useful for cutting or otherwise abrading surfaces.

One method of making a diamond-coated tool utilizes chemical-vapor deposition of carbon onto a substrate under conditions that are sufficient to grow diamond on the surface of the substrate. Typically, substrates to be diamond-coated are placed in a batch reactor in close proximity to several resistance heating filaments, and the reactor is slowly heated to the appropriate temperature. A mixture of hydrogen and hydrocarbon gas such as methane is heated to at least the temperature at which hydrogen gas dissociates and forms elemental hydrogen. Elemental hydrogen reacts with the hydrocarbon to form elemental carbon, and when this hot gaseous mixture is circulated around the substrate, carbon is deposited on the substrate.

Several factors are important to successfully deposit carbon and grow diamond on the substrate's surface. The gases immediately surrounding the substrate must be hot enough to dissociate hydrogen and subsequently assist formation of elemental carbon. The substrate must also be sufficiently hot for a period which is long enough to affix elemental carbon to the substrate's surface or to other carbon deposited on the tool and to crystallize the carbon into diamond. The temperature at which the reaction occurs must be closely controlled to optimize diamond growth. The integrity of the resistance heating filaments is thus critical in achieving and maintaining the correct temperature for the duration of the reaction. If a heating filament breaks or sags, the temperature in the vicinity of the heating element drops, thereby creating unanticipated thermal gradients in the reactor and introducing substandard conditions for carbon deposition and diamond growth.

The condition and position of heating elements is therefore a critical factor in diamond growth. Resistance heating filaments are delicate and are easily broken during installation, heat-up, and/or normal operation of the reactor. Typical resistance heating filaments are approximately 0.002–0.06 cm thick and 30 cm long. Filaments expand when heated from room temperature to their typical operating temperature of 2500° C. and are thus subject to thermally-induced stresses that can break the filaments. Also, during carbon deposition, resistance heating filaments can react with carbon-bearing gases contacting the filaments and form a carbide, further lengthening and embrittling the filaments. It has been reported in the literature that typical tungsten resistance heating filaments expand about 20% in length because of carburization. Filaments can sag or droop and short-out because of contact with a ground source such as the reactor floor or structure. Further, filaments that are not taut are more likely to break because of vibrations that are naturally present in the reactor. Thus, heating filament expansion and breakage is a major source of inconsistent carbon deposition and diamond growth, and filament breakage is a major contributor to substandard diamond-coated cutting and abrading tools. Carburization of heating filaments usually requires new heating filaments to be installed after a batch of tools is made.

There have been a number of attempts to control filament breakage. U.S. Pat. No. 4,953,499 states that vertical, pre-stressed, curved filaments alleviate filament breakage or filament/filament or filament/substrate contact and thereby compensate for thermal expansion and expansion caused by filament carburization. The filaments are typically pre-stressed in a suitable jig. However, this method is expected to result in significant breakage of brittle filaments such as tungsten filaments during the pre-stressing step, thereby adding to the cost of producing diamond-coated tools. Also, the bends introduced into the filaments would be expected to be mechanically weak, resulting in more filament breakage in use in the reactor than straight filaments would provide. It is also anticipated that these bends create internal stresses in the filaments that, upon heating, cause the filaments to bend in unexpected and unwanted directions, thereby misaligning the filaments. Further, these curved filaments are mounted to non-adjustable fixed electrodes on each end, causing the filaments to bend even more as they gain mass and length due to carburization.

A further attempt to reduce the incidence of filament breakage is disclosed in U.S. Pat. No. 4,958,592. '592 states that a vertical heating-element may be maintained without coiling and without flexing when connected to a counterbalancing weight assembly.

The '592 counterbalancing weight assembly is a complex assembly that is unadjustable during use and that consists of numerous elements. A filament tensioning rod runs through a low-friction bearing said to have axial and longitudinal freedom of movement. The tensioning rod is connected to a single filament on one end and to a lever arm on the other end. The lever arm has a counterweight on the end opposite to the end to which the tensioning rod is attached, and the lever arm is suspended about a fulcrum point by a cable. The mass of the lever-arm counterweight is determined by the mass of the tensioning rod and the distances of counterweight and tensioning rod from the fulcrum point. The cable suspending the assembly rides on a pulley and has a second counterweight attached to the cable that equals the sum of the tensioning rod and counterweight masses. The pulley suspends the whole assembly of cable, counterweights, lever arm, and tensioning rod in mid-air.

This counterbalancing weight assembly is expected to have numerous problems. First, the entire assembly is suspended in mid-air and is thus prone to rocking, swaying, and/or pivoting in any environment but one in which the air around the assembly is absolutely quiescent. A completely quiescent environment is quite difficult to achieve, especially since the '592 assembly is connected to a heated oven that creates natural convection currents in the air around the outside of the oven and around the counterbalancing weight assembly. Vibration from associated equipment will also invariably be transmitted into the counterweight assembly through the pulley, the reactor, or the air around the counterweight assembly. The '592 assembly is analogous to a dumbbell suspended from a cable, which cable is slung over a pulley and to which cable a mass equal to the dumbbell's mass is suspended. Any external forces that are transmitted to the suspended dumbbell set it into motion that is difficult to stop because of the large moment of inertia of a dumbbell. The rocking dumbbell is essentially free to pivot about the fulcrum in any manner. The dumbbell can rock up and down about the fulcrum; it can swing in an arc from side to side at the end of the cable; it can pivot about the cable; or it can make any combination of these movements. Any of these movements would be expected to induce significant forces (compression or tension) into the delicate filament attached to the end of the tensioning rod, subjecting the filament to stresses that could easily cause failure of the filament during reactor operation.

The '592 counterweight assembly also has no provisions to overcome hysteresis inherent in its design. The low-friction bearing disclosed in the '592 assembly has two-dimensional freedom of movement, so it can accommodate radial movements and longitudinal movements of the tensioning rod. However, the bearing cannot accommodate a three-dimensional motion such as a rocking motion of the assembly. The tensioning rod would likely bind in the bearing, particularly at the high temperatures to which the bearing is subjected at the reactor, until the lever arm moved to a position where the tensioning rod was no longer binding in the bearing. Then, the force would suddenly be instantaneously relieved axially and/or longitudinally. This could subject the filament to an unwanted force of magnitude sufficient to break the filament.

An additional problem of the '592 assembly is the precision required in setting-up the assembly. The mass of each counterweight must be precisely controlled, and the pivot point must also be precisely positioned to establish a balanced system and to prevent the assembly from subjecting the filament to a substantial and incorrect force during reactor operation.

Also, each '592 counterweight assembly is attached to only one filament. Typical reactors utilize at least eight to ten filaments and can have approximately 30 or more filaments, which are all replaced after a batch of diamond-coated tools are produced. Thus, many counterweight assemblies must be precisely fabricated or overhauled for each run, and after each run, the assemblies must again be precisely reconstructed and adjusted. The '592 counterweight assembly would consequently require substantial maintenance and adjustment between batches.

The '592 counterweight assembly is subject to many problems that would limit the system's ability to prevent premature breakage of filaments. The '592 patent states that "an appropriate system of spring biasing means may be employed to reduce the tension on [the] heater filament . . . to 0 at its incandescent temperature[,]" but '592 is silent on what the "appropriate system of spring biasing means" might be.

Another attempt to prevent filament breakage during operation is disclosed in U.S. Pat. No. 4,970,986. This system utilizes a plurality of reactor-enclosed spring means attached to an equal plurality of movable electrodes to maintain an equal number of filaments taut. This system has numerous shortcomings.

Each spring is attached at one end to a fixed frame contained within the reactor and at its other end to its own movable electrode, also contained within the reactor. Each electrode is attached to a single filament. Each spring is presumably pre-tensioned prior to sealing the reactor and operating it. There are no provisions to allow adjusting the tension on filaments after servicing the reactor and closing it. There especially is no provision to adjust each steel spring as it carburizes and hardens in the hot carbon-bearing gases present in the reactor. The '986 patent recognizes that over-tensioning the spring can occur and provides a plug attached to each delicate filament in an attempt to prevent over-tensioning of the filament by the spring. However, if this plug is not precisely adjusted, the filament will be over-tensioned or under-tensioned at some point in its operating cycle, and if the set-screw for the plug is over-tightened, the filament is weakened.

Since there are multiple filaments, there are many opportunities to incorrectly adjust a plug and cause premature filament breakage. Each time that the filaments and/or springs are changed, the plug positions must be adjusted. Any variations in spring length, spring constant, or filament length used from one batch of tools to the next requires compensation for and adjustment of each new spring and filament. Further, the multiple spring, electrode, and guide bearing assemblies of the '986 patent require more time to be spent maintaining the reactor between cycles and provide more opportunities for equipment failure during operation.

The electrode and spring design in the '986 reactor also can create substantial vibrations in the filaments during reactor operation. Current passing through the filaments creates strong electric and magnetic fields around each filament, and the fields of adjacent filaments interact to repel the filaments from each other. The small electrode and flexible spring on the end of each filament allow fairly free lateral movement of that end of the filament. Thus, the free ends of the filaments can be whipped about by the electric and magnetic fields induced by flowing current, causing the filaments to vibrate strongly if the spring on each filament is only designed to absorb the growth of the filament. Thus, strong vibrations and consequent filament failure must be accepted, or springs must be selected to exert a much stronger force on the filaments to restrict the amount of vibration as well as to compensate for filament growth. Even with a stronger spring, the filaments in the '986 reactor experience vibrational forces in all directions, especially at locations near the ends of the filaments, creating stresses in the filaments that can break them. Because of stronger springs, the filaments are also subjected to more tension in the '986 reactor than would be present in a reactor designed to minimize such vibrations and which has to compensate primarily for filament growth. This additional tension can also contribute to failure of the hair-like heating filaments.

The '986 reactor has another short-coming. The copper power-supply braid attached to each movable electrode must be a fairly substantial braid in order to supply large quantities of power and also to withstand the high temperatures present near the 2000°–2500° C. filaments. The braid adds weight that the spring must overcome, and differences in braid weight must be taken into account when adjusting each filament/spring assembly between batches. Further, the braid can bind, especially at elevated temperatures, causing unpredictable stresses that the spring must try to overcome to maintain its filament taut.

The filament and reactor designs discussed previously have not provided designs that both adequately address premature filament breakage and provide a system that can be easily maintained and quickly fitted with new filaments between batches. In the '499 patent, the bowed filaments bow out even further and in unpredictable directions because carburization lengthens the filaments, creating more force on the filaments at the bend points (compressive force on the inside sections of the bends and tension on the outside sections of the bends) and causing misalignment of the filaments. In the '592 patent, the multiple counterweight balances are a maintenance-intensive system for tensioning filaments, and uncontrolled forces are easily introduced by normal operating conditions such as vibration and high temperature present at the reactor. In the '986 patent, many springs, electrodes, filaments, power-supply braids, and over-tension plugs must be changed and/or adjusted between batches, the filaments fatigue from substantial forces in varying directions because of vibration and/or strong spring tension, and carburization changes the spring constant of each spring during reactor operation. The prior art has not provided an easily-maintained reactor that effectively solves the problem of carburization of filaments and other components present in the reactor.

Therefore, one object of this invention is to provide an apparatus that can maintain a substantially constant force on the filaments in an array during operation of the filaments. Another object of this invention is to provide a simple, adjustable apparatus for maintaining a substantially constant force on filaments in an array over the life of the filaments, which apparatus requires little maintenance and equipment set-up between cycles. A further object of this invention is to provide a force on filaments in an array that is parallel to the axes of the filaments. These and other objects are apparent from the disclosure herein.

SUMMARY OF THE INVENTION

In one embodiment of the invention, a reactor is provided that is useful in chemical vapor deposition of carbon on a substrate for growing diamond on the surface of the substrate. The reactor comprises a heating filament array having at least two heating filaments and a force regulator that is attached to the heating filament array. The use of an array and a force regulator that acts on the array in a reactor produces an easily-maintained reactor with quick turnaround time between batches of tools. A preferred adjustable force regulator can be adjusted prior to and/or during operation of the reactor, if desired, and can maintain a substantially constant force on the heating filaments over the fill operating cycle of the filaments.

In another embodiment of the invention, a method is provided for preventing breakage of a heating filament, where the method comprises connecting a force regulator to a heating filament array, and applying a force on the array with the force regulator. This method provides a reaction zone in a reactor that has no unexpected thermal gradients and that consequently produces, e.g., diamond-coated tools more consistently than a reactor which is not operated by the above method.

In a further embodiment of the invention, a reactor is provided that has a heating filament array attached to a means for applying a force on the filaments of the array. This reactor maintains the force on its filaments substantially constant despite filament growth and can also minimize the vibration to which filaments are subjected.

The invention further provides an improved method of making diamond coated tools in a chemical vapor deposition reactor comprising forming a heating filament array, attaching a force regulator to the array, applying a force to the array via the force regulator, and depositing carbon on a substrate at conditions sufficient to grow diamond thereon. Diamond-coated tools made by this method are very uniform and are produced in high yield (i.e. fewer rejects).

Among other factors, this invention is based on the technical finding that a reactor having an array of heating filaments attached to a force regulator, especially an adjustable force regulator, experiences virtually no filament failure during operation, has a fast turn-around time between batches because of its ease of set-up and maintenance, and has less vibration in filaments during operation than many existing reactors. These and other factors and advantages are apparent from the discussion herein.

DETAILED DESCRIPTION OF PREFERRED EMBODIMENTS

Figure 1:
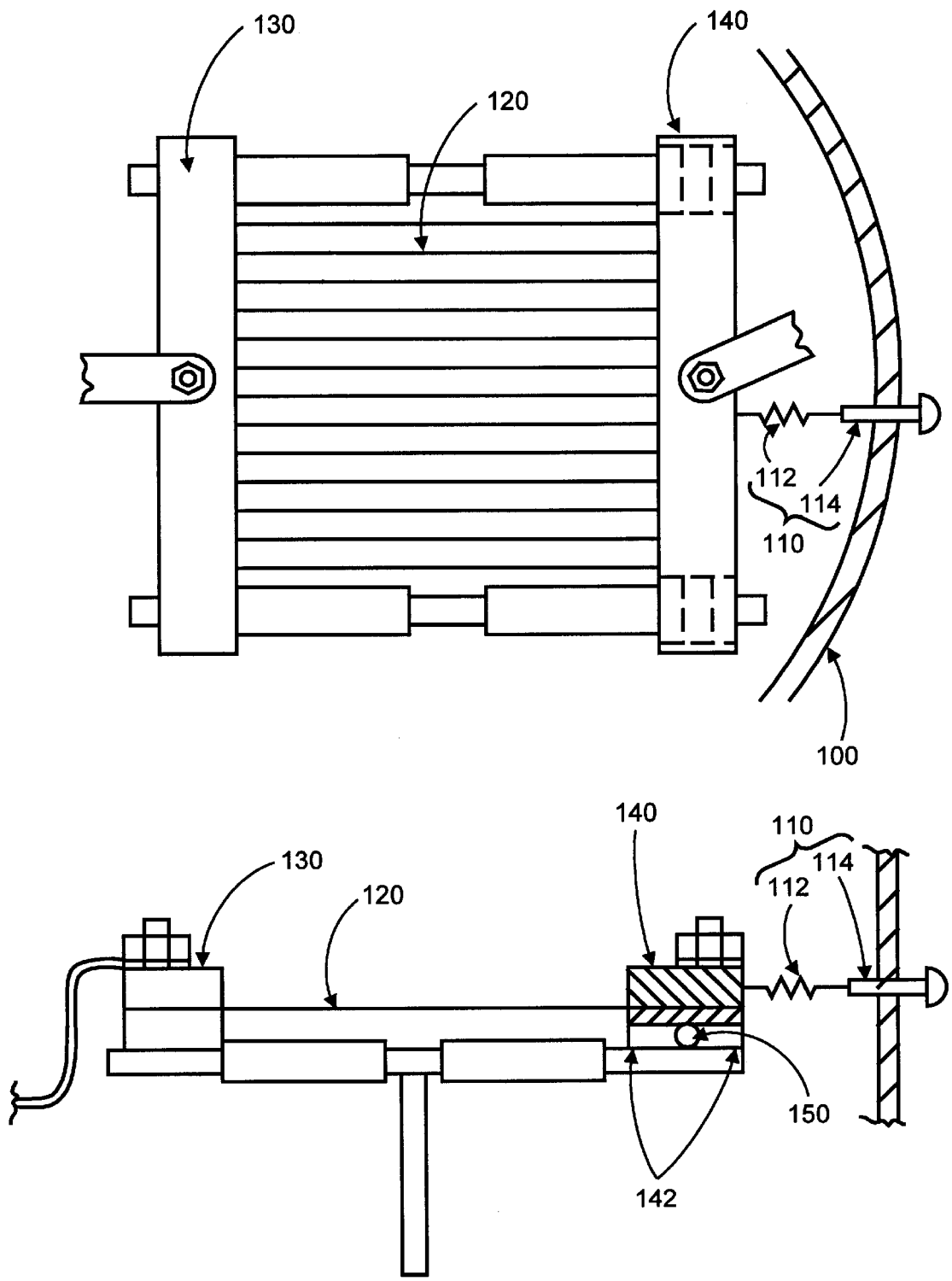
FIG. 1 illustrates one embodiment of the invention, where an adjustable force regulator is used to adjust and control the force on an array of filaments having a movable filament electrode that rides on a titanium support rod.
Figure 2:
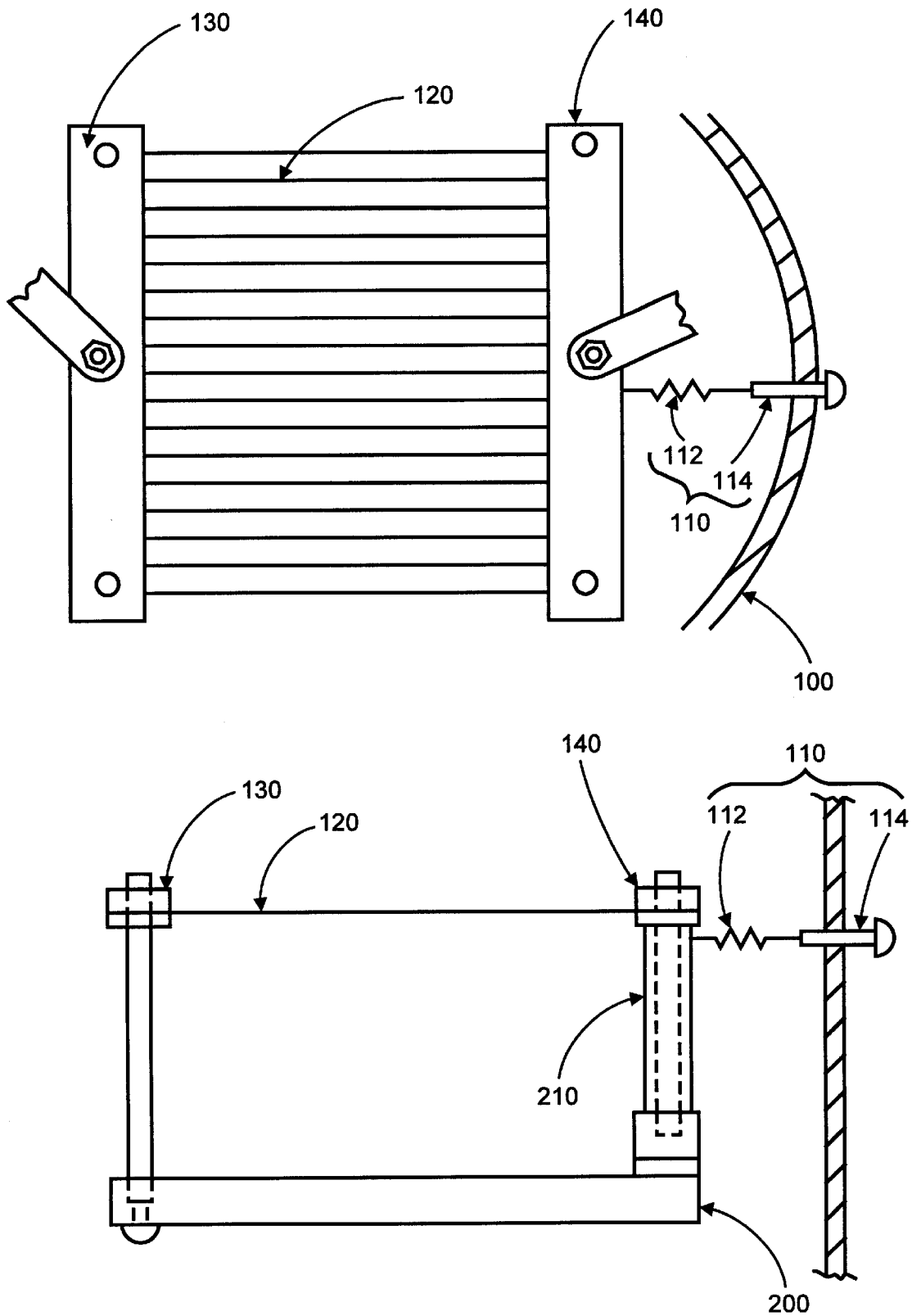
FIG. 2 illustrates a second embodiment of the invention, where an adjustable force regulator is used to adjust and control the force on an array of filaments having a movable filament electrode that pivots on a flexure.
Figure 3:
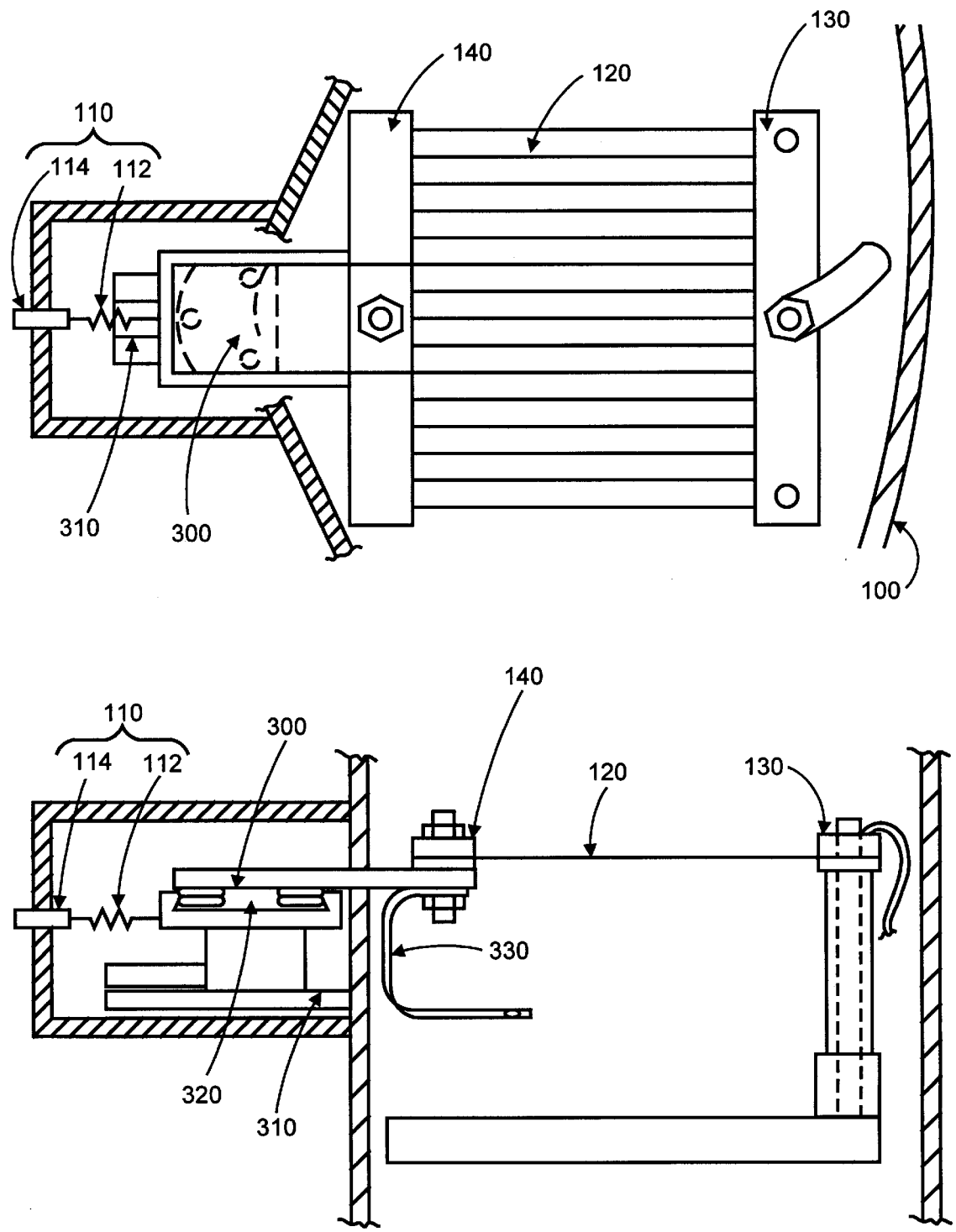
FIG. 3 illustrates a third embodiment of the invention, where an adjustable force regulator is used to adjust and control the force on an array of filaments having a movable filament electrode mounted on a cantilever, which is mounted on a track and is free to pivot on its support.

In one aspect of the invention, a chemical vapor deposition reactor is used to deposit carbon on substrates for diamond growth and is fitted with a force regulator attached to an array of the reactor's filaments. FIGS. 1, 2, and 3 show three different embodiments of a reactor 100 fitted with an adjustable force regulator 110 attached to an array of heating filaments. The filaments are made of a material that heats upon passing an electrical current through it. Illustrative materials are metallic tungsten, tantalum, molybdenum, and rhenium, with tungsten being preferred. Although each embodiment in FIGS. 1–3 shows preferred horizontal filaments 120, the embodiments of this invention are applicable to a reactor which utilizes vertical filaments instead of or in addition to the horizontal filaments shown in the figures.

In all figures, resistance heating filaments 120, of approximately the same length as the other filaments, are attached to two electrodes to form an array of filaments. One electrode 130 has its position fixed for convenience of operation and construction of the reactor. The other electrode 140 is movable so that the force on a filament 120 may be adjusted as the filament lengthens from carburization, and the mechanism providing for essentially free movement of the movable electrode is the primary difference among the three reactors illustrated. At least two filaments are attached to a common movable electrode to form a heating filament array, and preferably all of the filaments in the reactor are attached to a movable electrode of a heating filament array. The movable electrode is attached to a force regulator, shown in the illustrations as an adjustable force regulator comprising a spring 112 in tension attached on its other end to an adjustment screw 114, thereby providing an adjustable tensioning means. Substrates on which diamond is to be deposited are situated substantially parallel to the filaments on holders (not shown in the diagrams for sake of clarity).

The force regulator supplies enough force to take up substantially all or all filament growth due to thermal expansion and carburization during reactor operation. In one mode of operation, the force exerted by an adjustable force regulator on the filaments in an array is adjusted after replacing the filaments but while the reactor is cold, prior to applying power to heat the reactor. In other modes of operation, the force on the filaments in the array can be adjusted during reactor use instead of or in addition to the cold adjustment.

In another embodiment of the invention, the adjustable force regulator's adjustment screw may be used to periodically adjust the force applied to the filaments as the filaments grow to maintain an approximately constant force on the filaments. The screw is screwed in or out to decrease or increase the amount of force supplied by the spring, compensating for forces imposed on the filament by thermal and carburization growth and also compensating for any hysteresis imposed on the filament/force regulator system.

An applied tension force of no more than a few ounces is typically needed to maximize filament life. Preferably, the total tension to which a filament is subjected is less than about 0.1 ounce and is as close to zero as is practicable. The spring supplies sufficient force between adjustments to prevent breakage of filaments. A spring of low spring rate (i.e. force divided by change in spring length) is preferred, to minimize the change in tension force as the filaments expand.

FIGS. 1, 2, and 3 show three ways for obtaining a fairly smooth movement of the movable electrode in the hot reactor environment. FIG. 1 shows the movable electrode to which the force regulator is directly connected riding on two short rollers (one of which is shown as rod 150). The movable electrode 140 may have skirts 142 that deflect dirt or diamond flecks and that reduce rocking motions of the electrode on whatever rolling support means is used. The roller should be smooth and have an essentially constant radius to prevent hysteresis. The surfaces on which the roller rides should also be smooth and may be another roller. The roller and surfaces on which the roller rides can be made of any material suitable for use in the hot reactor environment, such as quartz, alumina, titanium, molybdenum, tungsten, or other refractory metal. Suitable rollers include wheels, wheels mounted to casters, and ball or roller bearings. The force regulator may be located outside the reactor and/or may be positioned in a cooled zone of the reactor to increase mechanical reliability, prevent carburization of the force regulator's components, improve reliability of the force regulator, and reduce hysteresis. A cooled reactor zone can be supplied by a chiller attached to a zone that is partially or essentially completely baffled or otherwise isolated from the movable electrode, filaments, and substrates on which diamond is being deposited.

FIG. 2 shows the movable electrode 140 to which the force regulator 110 is attached pivoting about a flexure 200. The electrode itself may be connected directly to the flexure, but for improved operation, the electrode is attached to one end of a spacing rod 210 whose opposite end is connected to a flexure. The spacing rod provides an arc of movement for the movable electrode that is much larger in radius than where the movable electrode is connected directly to a short flexure. The electrode's large radius of movement places less stress on filaments in directions other than the direction of force provided by the force regulator. The flexure and/or force regulator may be located outside the reactor and/or may be positioned in a cooled zone as discussed above. The flexure may be a hinge, a thin (0.01–0.03 cm) flexible piece of metal such as stainless steel, either untensioned or slightly pretensioned, or the like. Any joint that flexes and that is made of a material suitable for use in the environment around the joint may be used as a flexure. Other joints that flex, besides those discussed already, include ball joints, universal joints, and bearings. One or multiple flexures may be used. One flexure may be used, centered under the movable electrode, or multiple flexures may be distributed under the movable electrode.

FIG. 3 shows the movable electrode connected to a cantilever 300, which is mounted on a linear slide 310 through a pivot 320. The cantilever provides gentle forces to both slightly tension the filaments and to realign them. The cantilever assembly and/or the adjustable force regulator may be located outside the reactor and/or may be positioned in a cooled zone of the reactor as discussed above. The cantilever may be mounted on a slide, preferably of low friction, or may roll over rollers or ball bearings as found in a recirculating ball slide, for instance. A cantilever may be mounted on a pivot such as a ball joint or a bearing with a cantilever support rod in the bearing and mounted to the slide, but preferably the pivot is a track bearing assembly as illustrated in FIG. 3 that has a radius of movement such that its pivot point is between the movable electrode and the track bearing assembly, and more preferably the pivot point is close to the movable electrode. The movable electrode is also attached to a conductive wire or strap 330 (shown as a ground strap attached to the reactor wall in FIG. 3 and not shown in FIGS. 1 and 2 for sake of clarity) that is of sufficient gauge, length, and flexibility that the wire or strap can conduct the power needed to heat the filaments but not impede movements of the filament array. The wire or strap is typically made of copper, and the wire or strap may be a single- or multilayer wire, strap, or braid. A long, flexible wire or strap moves and flexes easily, allowing the filament array to move as needed. A long wire or strap can also be routed away from the direct heat of the filaments. The mass of the wire or strap is typically much less than the sprung mass of the filament array, and consequently the mass of the wire or strap does not impede movement of the filament array. This is especially true when the filament array is horizontal, since the weight of the wire or strap acts predominantly vertically on the movable electrode and its support instead of horizontally on the filaments.

The force regulator and movable electrode to which the force regulator is attached provide a force on the filaments that substantially corresponds to or is substantially parallel to the axis of the filaments and that is substantially equal on all filaments. A taut filament has a radius and an axis that is perpendicular to its radius. A force that does not correspond to or is not parallel to the axis of the filament can cause additional stresses in the filaments that can lead to premature breakage and/or can move the filaments relative to the substrates on which diamond is being deposited. A filament that becomes slack during reactor operation will, of course, require small forces that do not correspond to or that are not parallel to the axis of the filament in order to straighten the filament. A force that substantially corresponds to or is substantially parallel to the axis of the filaments will also usually supply the small forces necessary to straighten the filaments.

During operation, filaments grow from carburization and from thermal expansion. The force regulator acts on the movable electrode to maintain the filaments taut. The force regulator provides a sufficient amount of force that, in conjunction with the movable electrode to which it is attached, the filaments remain substantially parallel and properly aligned with the substrates, but the force is not so high as to over-tension the filaments after installation. The movable electrode to which the force regulator is attached is preferably free to pivot and move about its center point in a direction perpendicular to the filaments, so that the movable electrode can assume a position that is not square with the fixed electrode, if necessary. Such pivoting and movement assists straightening the filaments and also helps to absorb unequal growth of filaments. The movable electrode of the array is also preferably so designed that it rigidly clamps its filaments' ends, thereby preventing substantial vibration of the filaments at the spring end. For horizontal filaments, the size and weight of the movable electrode can be selected to provide sufficient clamping force. For vertical filaments, it is preferable to provide guide tracks on each end of the movable electrode to prevent unwanted spiraling and bouncing of the movable electrode and filaments that could be caused by the flow of hot gases around the filaments and movable electrode.

The force regulator need not be adjustable. For example, a spring may be secured on one end to a post in the reactor and to a movable electrode on its other end to provide a means for applying a force to the filaments in the array. The array assures that the filaments will remain substantially parallel and properly aligned with the substrates, so long as the force regulator supplies sufficient force to accommodate most or all thermal growth and carburization of filaments. However, the force regulator is preferably an adjustable force regulator. An adjustable force regulator permits easy and quick adjustment of the force on an array at any time after the filaments are secured in the electrodes. An adjustable force regulator can also be adjusted at any time to provide sufficient force to realign filaments that are grossly misaligned, and the tension can be readjusted to remove any force that is unnecessary to maintain the filaments substantially constant thereafter. The adjustable force regulator 110 shown in the illustrations is a manually-adjustable spring which operates on an array of filaments and which is located within the reactor. This simple mechanism provides a very inexpensive and reliable way to maintain an approximately constant force on the filaments in the filament array. The invention is by no means limited to this embodiment. For instance, force regulators may be individually attached to multiple arrays of filaments present in a reactor, multiple force regulators may be attached in parallel to an array of filaments, or one force regulator may be attached to multiple arrays of filaments. The force regulator may be located within the reactor or outside of the reactor. Other force regulators may be substituted for the manually-adjustable spring. These include: a manually-adjustable rod with securing clamp, where a person pulls the rod with the appropriate force and clamps it into position periodically during reactor operation; a spring operating in compression; an adjusting screw attached to a bimetallic strip or to elastic straps; a threaded rod with an adjusting and/or securing nut; a rack and pinion; a worm-gear or other gear assembly acting on a toothed rod or plate that is attached to a movable electrode; and an actuated cylinder such as a pneumatic or hydraulic cylinder acting on a movable electrode. Operation need not be manual. For instance, a strain gauge can be used to measure the force applied, and this measurement can be used manually or automatically to control the force on filaments. An optical device for measuring sag may be used alone or in combination with the strain gauge or other devices. Feedback and/or feed forward control may be utilized to ultimately control the tension on filaments. The force applied to the filaments may be adjusted constantly or continuously rather than periodically.

Further, a fixed electrode is not necessary. Both electrodes may be movable, and either or both of the electrodes may have a force regulator attached.

The word "attached", as used in the following claims, does not preclude having structure intermediate to the structures that are discussed in the claims. For example, a force regulator may be attached to the movable electrode through an electrical or thermal insulator and/or an additional structure that, for example, dampens vibrations.

While the invention has been described in connection with what is presently considered to be the preferred embodiments, it is to be understood that the invention is not limited to the disclosed embodiments, but on the contrary, covers various modifications and equivalents included within the spirit and scope of the following claims. Therefore, persons of ordinary skill in this field are to understand that all such equivalents are included within the scope of the claims.

What is claimed is:

1. A reactor, comprising:

a first electrode;

a movable electrode spaced from the first electrode, wherein the movable electrode is adapted to pivot about a line intersecting and perpendicular to the movable electrode;

a heating filament array attached to the first electrode and to the movable electrode;

an assembly, attached to the movable electrode, adapted to pivot about the line; and a force regulator coupled to the assembly to apply tension to the heating filaments.

2. The reactor of claim 1 wherein the reactor is a chemical vapor-deposition reactor.

3. The reactor of claim 1 wherein the reactor is a carbon-deposition reactor.

4. The reactor of claim 1 wherein the heating filament comprises tungsten.

5. The reactor of claim 1 wherein the force regulator is an adjustable force regulator.

6. The reactor of claim 5 wherein the adjustable force regulator comprises a spring attached to an adjusting screw.

7. The reactor of claim 5 wherein the adjustable force regulator comprises an actuated cylinder.

8. The reactor of claim 1 wherein the movable electrode sits on a roller on which the electrode may roll.

9. The reactor of claim wherein the roller is a rod.

10. The reactor of claim wherein the movable electrode is attached to a flexure.

11. The reactor of claim 1, wherein the assembly is a cantilever.

12. The reactor of claim 11 wherein the cantilever has a pivoting slide on which the movable electrode is mounted.

13. The reactor of claim 1 wherein the heating filament array comprises all filaments in the reactor.

14. A reactor comprising a heating filament array having a movable electrode and means for applying a force on the filaments of the array, wherein the means for applying the force is attached to a pivoting, slidable assembly connected to the movable electrode.

15. The reactor of claim 14 wherein the means for applying a force on the filament is an adjustable tensioning means.

16. The reactor of claim 15 wherein the adjustable tensioning means comprises a spring attached to an adjusting screw.

17. The reactor of claim 14 wherein the array is comprised of all filaments in the reactor.

18. The reactor of claim 14 wherein the movable electrode sits on a rolling support means that supports the movable electrode and allows the electrode to move.

19. The reactor of claim 14 wherein the movable electrode is attached to a joint that flexes to allow the electrode to move.

20. The reactor of claim 14 wherein the means for applying a force on the filament and the array are attached on opposite sides of a pivoting and sliding assembly on which the electrode rides.

21. The reactor of claim 14 wherein the means for applying a force applies a force that is substantially parallel to the axis of the filament.

22. A reactor comprising a heating filament array having a movable electrode and a force regulator attached to the movable electrode wherein the movable electrode sits on a roller on which the electrode may roll.

23. The reactor of claim 22 wherein the roller is a rod.

24. The reactor of claim 22 wherein the movable electrode is attached to the force regulator through a cantilever, and wherein the cantilever has a pivoting slide on which the movable electrode is mounted.

25. A reactor, comprising a heating filament array having a movable electrode and a means for applying a force on the filaments of the array, wherein the means for applying a force on the filaments of the array is attached to the movable electrode, wherein the movable electrode sits on a rolling support means that supports the movable electrode and allows the electrode to move.

26. A reactor comprising a heating filament array having a movable electrode and a means for applying a force on the filaments of the array, wherein the means for applying a force on the filaments of the array is attached to the movable electrode, wherein the means for applying the force on the filament and the array is attached on opposite sides of a pivoting and sliding assembly on which the electrode rides.

27. A reactor, comprising:
   a fixed electrode;
   a pivoting electrode, spaced apart from the fixed electrode;
   a plurality of heating filaments, wherein each heating filament is attached at one end to the fixed electrode and attached at the other end to the pivoting electrode; and
   a force regulator coupled to the movable electrode to maintain the heating filaments under tension.

28. The reactor of claim 27, further comprising a roller in contact with the pivoting electrode and a roller surface.

29. The reactor of claim 27, further comprising flexures attached to the pivoting electrode which pivots about the flexures.

30. The reactor of claim 27, further comprising flexures and spacing rods, wherein the pivoting electrode is attached to one end of each spacing rod which is attached to one end of each flexure, wherein the pivoting electrode pivots about the flexures.

31. The reactor of claim 27, wherein the force regulator comprises a spring attached to a screw to adjust the tension of the force regulator.

32. The reactor of claim 27, further comprising a cantilever assembly coupled to the force regulator and to the pivoting electrode, the cantilever assembly including a cantilever and a slide, wherein the cantilever is slidably mounted on the slide and rotatably mounted about the pivot.

* * * * *